(12) United States Patent
Mun

(10) Patent No.: US 11,264,419 B2
(45) Date of Patent: Mar. 1, 2022

(54) IMAGE SENSOR WITH FULLY DEPLETED SILICON ON INSULATOR SUBSTRATE

(71) Applicant: OMNIVISION TECHNOLOGIES, INC., Santa Clara, CA (US)

(72) Inventor: Seong Yeol Mun, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 156 days.

(21) Appl. No.: 16/730,756

(22) Filed: Dec. 30, 2019

(65) Prior Publication Data

US 2021/0202553 A1    Jul. 1, 2021

(51) Int. Cl.
*H01L 27/146* (2006.01)

(52) U.S. Cl.
CPC .... *H01L 27/14616* (2013.01); *H01L 27/1461* (2013.01); *H01L 27/14643* (2013.01); *H01L 27/14689* (2013.01)

(58) Field of Classification Search
CPC .......... H01L 27/1463; H01L 27/1461
See application file for complete search history.

(56) References Cited

U.S. PATENT DOCUMENTS

| | | | | |
|---|---|---|---|---|
| 5,705,427 A * | 1/1998 | Chan | ....................... | H01L 21/28 257/E21.166 |
| 6,080,620 A * | 6/2000 | Jeng | ................... | H01L 27/10852 257/E21.019 |
| 6,100,138 A * | 8/2000 | Tu | ..................... | H01L 27/10852 257/296 |
| 6,146,997 A * | 11/2000 | Liu | ................... | H01L 21/76897 438/639 |
| 6,287,957 B1 * | 9/2001 | Linliu | ............... | H01L 21/76897 257/E21.507 |
| 6,472,261 B2 * | 10/2002 | Nguyen | ................ | H01L 21/768 257/E21.507 |
| 8,722,523 B2 * | 5/2014 | Schloesser | ........ | H01L 21/28525 438/585 |
| 9,147,748 B1 * | 9/2015 | Xie | ........................ | H01L 29/495 |
| 9,536,980 B1 * | 1/2017 | Huang | ............. | H01L 21/76877 |

(Continued)

FOREIGN PATENT DOCUMENTS

JP    2013093371 A  *  5/2013

OTHER PUBLICATIONS

Wada et al., Development of Low Power Cryogenic Readout Integrated Circuits using Fully-Depletedsilicon-on-Insulator CMOS Technology for Far-Infrared Image Sensors, Journal of Low Temperature Physics Manuscript, Jul. 17, 2011, 6 pages.

*Primary Examiner* — Jarrett J Stark

(74) *Attorney, Agent, or Firm* — Christensen O'Connor Johnson Kindness PLLC

(57) ABSTRACT

A fully depleted silicon on insulator (FDSOI) is employed to reduce diffusion leakage (e.g., gate induced drain leakage, junction leakage, etc.) associated with the diffusion regions of a pixel cell. The buried oxide (BOX) layer, for example, fully isolates the transistor channel region, such as an (N) channel region of the pixel cell from the photodiode(s) of the pixel region, eliminating the junction leakage path, thus leading to a reduction in diffusion leakage and an increase device operation speed. An increase of full well capacity can also be realized by the absence of isolation structure, such as trench isolation or isolation implant structure.

29 Claims, 9 Drawing Sheets

(56) References Cited

U.S. PATENT DOCUMENTS

| | | | |
|---|---|---|---|
| 9,608,062 B1* | 3/2017 | Tseng | H01L 29/66545 |
| 9,608,065 B1* | 3/2017 | Bergendahl | H01L 27/0886 |
| 10,002,933 B1* | 6/2018 | Tang | H01L 29/42376 |
| 10,038,065 B2* | 7/2018 | Xie | H01L 27/0886 |
| 10,269,636 B2* | 4/2019 | You | H01L 21/76897 |
| 10,347,739 B2* | 7/2019 | Leobandung | H01L 21/28518 |
| 2004/0217407 A1* | 11/2004 | Cho | H01L 27/10891 257/306 |
| 2005/0064727 A1* | 3/2005 | Lee | H01L 21/31116 438/781 |
| 2005/0136683 A1* | 6/2005 | Lee | H01L 21/76897 438/737 |
| 2009/0163010 A1* | 6/2009 | Oh | H01L 21/76834 438/587 |
| 2010/0133641 A1* | 6/2010 | Kim | H01L 27/14689 257/459 |
| 2011/0156107 A1* | 6/2011 | Bohr | H01L 29/4966 257/288 |
| 2011/0183512 A1* | 7/2011 | Cho | H01L 23/5226 438/627 |
| 2011/0298061 A1* | 12/2011 | Siddiqui | H01L 29/4966 257/410 |
| 2012/0043592 A1* | 2/2012 | Zhao | H01L 21/76847 257/288 |
| 2012/0052667 A1* | 3/2012 | Kim | H01L 29/66545 438/586 |
| 2013/0075821 A1* | 3/2013 | Baars | H01L 21/76897 257/368 |
| 2013/0075826 A1* | 3/2013 | Xu | H01L 29/4966 257/369 |
| 2013/0137257 A1* | 5/2013 | Wei | H01L 21/76897 438/586 |
| 2013/0193489 A1* | 8/2013 | Baars | H01L 21/28518 257/213 |
| 2013/0277767 A1* | 10/2013 | Li | H01L 21/0228 257/411 |
| 2013/0292847 A1* | 11/2013 | Choi | H01L 45/144 257/774 |
| 2014/0035010 A1* | 2/2014 | Cai | H01L 29/66545 257/288 |
| 2014/0077305 A1* | 3/2014 | Pethe | H01L 23/5226 257/368 |
| 2014/0199837 A1* | 7/2014 | Hung | H01L 23/485 438/675 |
| 2014/0273386 A1* | 9/2014 | Tsao | H01L 21/28247 438/301 |
| 2014/0346575 A1* | 11/2014 | Chen | H01L 29/0692 257/288 |
| 2015/0021683 A1* | 1/2015 | Xie | H01L 21/823425 257/330 |
| 2015/0021696 A1* | 1/2015 | Sung | H01L 29/7848 257/368 |
| 2015/0035086 A1* | 2/2015 | Xie | H01L 29/511 257/411 |
| 2015/0108589 A1* | 4/2015 | Cheng | H01L 29/42368 257/411 |
| 2015/0206844 A1* | 7/2015 | Pham | H01L 21/76877 257/384 |
| 2015/0214289 A1* | 7/2015 | Kim | H01L 21/311 438/387 |
| 2015/0221696 A1* | 8/2015 | Lee | H01L 27/14636 257/292 |
| 2015/0364371 A1* | 12/2015 | Yen | H01L 21/76805 257/401 |
| 2016/0035857 A1* | 2/2016 | Leobandung | H01L 29/665 257/288 |
| 2016/0056262 A1* | 2/2016 | Ho | H01L 29/4966 257/288 |
| 2016/0190322 A1* | 6/2016 | Liu | H01L 29/66795 257/383 |
| 2016/0211251 A1* | 7/2016 | Liaw | H01L 21/76897 |
| 2016/0284817 A1* | 9/2016 | Basker | H01L 29/66545 |
| 2016/0293725 A1* | 10/2016 | Liou | H01L 29/42376 |
| 2016/0372332 A1* | 12/2016 | Pranatharthiharan | H01L 29/66628 |
| 2016/0379925 A1* | 12/2016 | Ok | H01L 21/76802 257/288 |
| 2017/0004997 A1* | 1/2017 | Lu | H01L 21/76802 |
| 2017/0047253 A1* | 2/2017 | Park | H01L 21/823821 |
| 2017/0084721 A1* | 3/2017 | Hung | H01L 29/41791 |
| 2017/0110549 A1* | 4/2017 | Xie | H01L 27/0886 |
| 2017/0170067 A1* | 6/2017 | Yeh | H01L 21/30604 |
| 2017/0186849 A1* | 6/2017 | Chen | H01L 21/76829 |
| 2017/0194211 A1* | 7/2017 | Lai | H01L 21/76897 |
| 2018/0033693 A1* | 2/2018 | Hung | H01L 23/535 |
| 2018/0033866 A1* | 2/2018 | Liao | H01L 21/28123 |
| 2018/0138176 A1* | 5/2018 | Shen | H01L 21/823431 |
| 2018/0174904 A1* | 6/2018 | Hsieh | H01L 29/785 |
| 2018/0211874 A1* | 7/2018 | Basker | H01L 29/66795 |
| 2018/0342420 A1* | 11/2018 | You | H01L 21/76834 |
| 2019/0131430 A1* | 5/2019 | Xie | H01L 29/785 |
| 2020/0006515 A1* | 1/2020 | Chen | H01L 29/66553 |
| 2020/0373409 A1* | 11/2020 | Chen | H01L 29/66469 |

\* cited by examiner

IMAGE SENSOR WITH FULLY DEPLETED SILICON ON INSULATOR SUBSTRATE

BACKGROUND INFORMATION

Field of the Disclosure

This disclosure relates generally to image sensors, and in particular but not exclusively, relates to image sensors, such as high dynamic range (HDR) image sensors, that aim to suppress diffusion junction leakage.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Integrated circuit (IC) technologies for image sensors are constantly being improved, especially with the constant demand for higher resolution and lower power consumption. Such improvements frequently involve scaling down device geometries to achieve lower fabrication costs, higher device integration density, higher speeds, and better performance.

But as the miniaturization of image sensors progresses, defects within the image sensor architecture become more readily apparent and may reduce the image quality. For example, excess current leakage within certain regions of the image sensor may cause high dark current, sensor noise, white pixel defects, and the like. These defects may significantly deteriorate the image quality from the image sensor, which may result in reduced yield and higher production costs.

High dynamic range (HDR) image sensors may present other challenges. For example, some HDR image sensor layouts are not space efficient and are difficult to miniaturize to a smaller pitch to achieve higher resolutions. In addition, due to the asymmetric layouts of many of these HDR image sensors, reducing the size and pitch of the pixels to realize high resolution image sensors result in crosstalk or other unwanted side effects, such as diagonal flare that can occur in these image sensors as the pitches are reduced.

Figure 1:
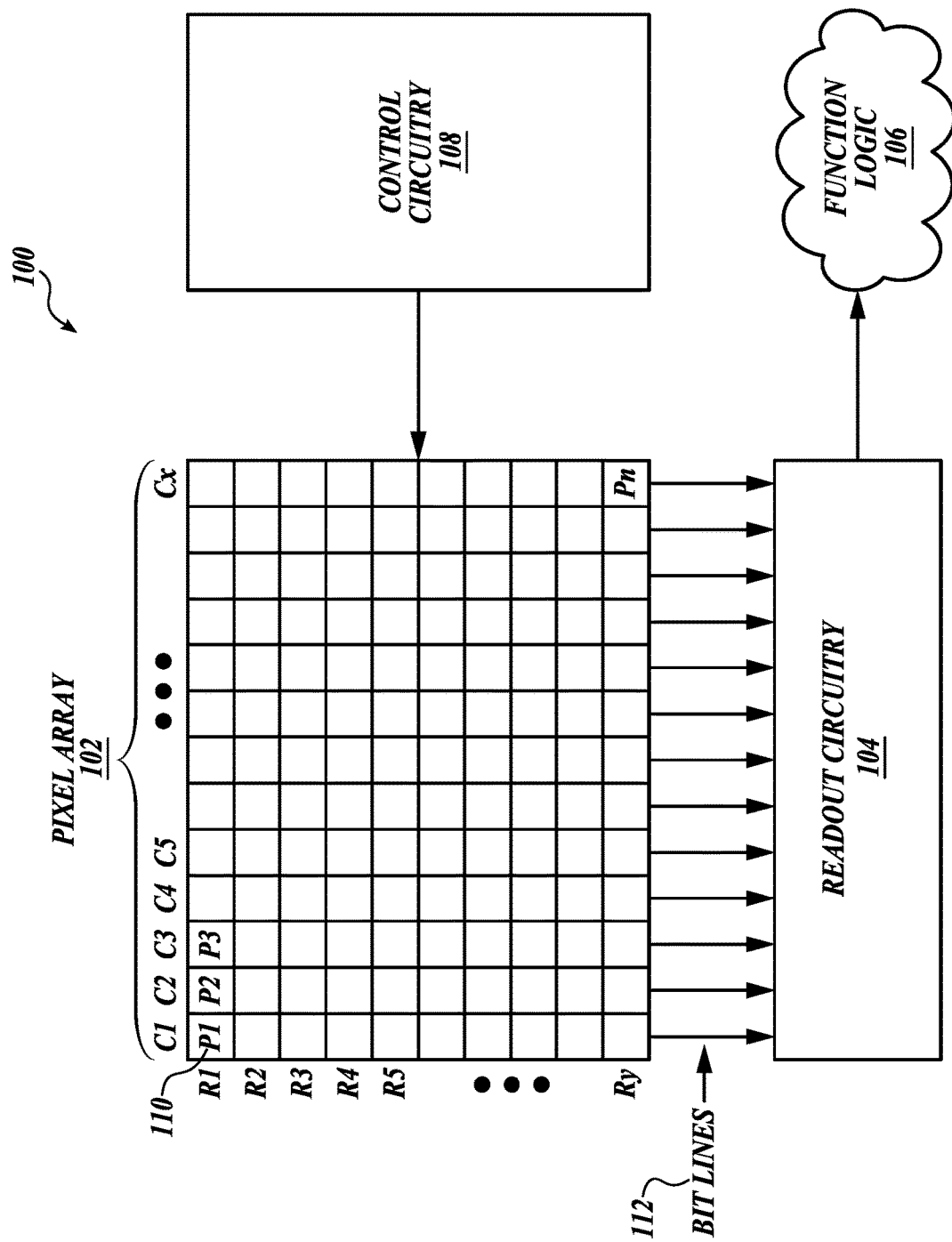
FIG. 1 illustrates one example of an image sensor according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

Examples of an apparatus and method for suppressing diffusion leakage in CMOS image sensors are described herein. Such examples of an apparatus and method also provide for an increase in the full well capacity (FWC) of the image sensor over conventional pixel cells. Thus, in the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

Additionally, it will also be understood that when a layer is referred to as being "between" two layers, it can be the only layer between the two layers, or one or more intervening layers may also be present. Similarly, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of a pixel cell of an image sensor are disclosed. One or more of these examples can be arranged in a pixel array and employed, for instance, for high dynamic range (HDR) imaging. In some examples, the pixel cells of the pixel array can employ 3 T, 4 T or 5 T pixel architectures. In some examples, a shared pixel cell architecture is employed in which two or more photosensitive regions, such as photodiode regions, are coupled to a common floating diffusion via a number of transfer gates.

Currently available pixel cell architecture frequently suffer from leakage current at or near the floating diffusion (FD) region(s). Leakage current may impact signal readout from the floating diffusion region(s) by readout circuitry due to deficiencies such as a high dark current, white pixel defects, low signal-to-noise ratio, and the like. White pixel defects, for example, may be related to current leakage from regions subjected to mechanical stress during fabrication, electrical stress during device operation, or a combination thereof. Leakage current may be a particularly significant issue when the image charge, image data, or image signal is stored within the floating diffusion region(s) for long periods of time before readout. In addition, leakage by Generation-Recombination (GR) in the floating diffusion junction, especially with the use of highly doped, ohmic contacts, is inevitable.

These aforementioned problems are only amplified in a LOFIC pixel cell, one common type of high dynamic range (HDR) imaging architecture. In a pixel cell with a LOFIC architecture, or LOFIC pixel cell, a lateral overflow integrated capacitor (LOFIC) and an associated select transistor, sometimes referred to as a Dual Floating Diffusion (DFD) transistor, are provided. When, for example, the photodiode is filled after reaching saturation, the excess charge is leaked into the floating diffusion (FD) region and can be stored in the LOFIC. Leaking charges in this manner functions like a photodiode with an increasing full well capacity (FWC). Selective increases/decreases in the capacitance of the floating diffusion (FD) of the pixel cell can be utilized to modulate conversion gains. This results in a significant increase the signal/noise ratio (SNR), thereby increasing the dynamic range (e.g., HDR) of the pixel cell.

Generally, floating diffusion junction leakage in dark mode (i.e., no light) is stored in the LOFIC during integration, contributing to dark-current/white pixel issues. In fact, dark-current caused by floating diffusion junction leakage is one of the biggest issues attributable to a LOFIC architecture. For example, in the case of high conversion gain (HCG), the dark-current caused by floating diffusion junction leakage is typically not an issue, because the floating diffusion is reset before signal read-out, and as such, read noise (including noise caused by junction leakage) can be eliminated by a correlated double sampling (CDS) operation. However, the floating diffusion junction leakage induced dark-current can be a significant issue in low conversion gain (LCG), because the signal is read out before reset-level read-out. As such, a correlated double sampling (CDS) operation cannot be applied to remove junction leakage noise. And if the signal is reset before it is read out, all the charges stored are depleted via discharge.

The methodologies and technologies of the present disclosure seek to address diffusion leakage in conventional 3 T and 4 T pixel architectures. The methodologies and technologies of the present disclosure are suitable for use, and may provide benefit to, other pixel architectures, including 5 T pixels, including a LOFIC pixel cell and those of a shared-pixel design. For instance, examples of the disclosed subject matter aim to minimize or reduce the leaking current at or near the floating diffusion region of a pixel cell for facilitating increased image quality, increased yield, faster speed, etc.

As will be described in more detail below, the transistors of the pixel cell in example embodiments may be of the N-metal-oxide-semiconductor (NMOS) type, in which the metal may be polycrystalline silicon (poly-Si), tungsten (W) and the like, the oxide may be a dielectric such as $SiO_2$ (e.g., thermally grown or deposited on the semiconductor material), and the semiconductor may correspond to a portion of the semiconductor material, such as silicon on insulator (SOI) wafer, etc.

In the various examples described herein, a fully depleted silicon on insulator (FDSOI) wafer substrate is employed to reduce diffusion leakage (e.g., gate induced drain leakage, junction leakage, etc.) in a pixel cell, for example a shared 4 T pixel cell, a LOFIC pixel cell, etc. In some example embodiments, the buried oxide (BOX) layer of the fully depleted silicon on insulator (FDSOI) semiconductor substrate fully isolates the transistor channel region, for example the photosensitive regions, of the pixel cell from the pixel region, thereby eliminating the junction leakage path, and leading to a reduction in diffusion leakage and an increase in device operation speed.

As will be described in more detail below, the fully depleted silicon on insulator (FDSOI) wafer in the example pixel cells also provides one or more of the following benefits. For example, the fully isolated transistor channel region allows for the omission of the isolation structure (e.g., the shallow isolation trench (STI) structure, the heavy doped (P+) isolation implant region, etc.) typically disposed adjacent the photodiode regions of a pixel cell. Without the need for both the implant region and the shallow isolation trench (STI) structure, the space normally occupied by these isolation components can be utilized for larger photodiode areas, leading to an increase in full well capacity (FWC) for high dynamic range (HDR) imaging.

Other benefits can be realized by the absence of the shallow isolation trench (STI) structure and/or the (P+) isolation implant. For example, in addition to an increase in full well capacity, the absence of the (P+) isolation implant improves image lag by avoiding the photodiode potential neck (i.e., the higher potential barrier between the photodiode and the transfer channel) caused by such (P+) isolation implants. In addition, removal of the shallow isolation trench (STI) structure can reduce dark-current significantly, especially in small pixel cells.

Further benefits for employing fully depleted silicon on insulator (FDSOI) technology include the absence of junction-capacitance, which can increase spread-out speed by reducing resistor capacitor (RC) delay. And the reduced junction-leakage current at the floating diffusion junction can significantly reduce floating diffusion junction-leakage induced dark-current in a LOFIC pixel cell.

In the example described below, the photodiode(s) of the pixel region can be extended under the pixel transistor region (e.g., in an overlapping manner) without floating diffusion junction leakage concerns. In some examples, the photodiode(s) can be extended under the pixel transistor region of pixel cell, which can be comprised of a reset transistor, a source follower, and a row select transistor. In other embodiments, the photodiode(s) can be extended under the pixel transistor region comprised of a reset transistor, a source follower, a dual floating diffusion transistor, and a row select transistor. Such an architecture allows for a larger full well capacity (FWC), which can increase the pixel cell's dynamic range.

To illustrate, FIG. 1 illustrates a block diagram illustrating an example image sensor 100 with reduced diffusion leakage and an increase in full well capacity (FWC) in accordance with technologies and methodologies of the present disclosure. Image sensor 100 may be implemented as complementary metal-oxide-semiconductor ("CMOS") image sensor. As shown in the example illustrated in FIG. 1, image sensor 100 includes pixel array 102 coupled to control circuitry 108 and readout circuitry 104, which is coupled to function logic 106.

The illustrated embodiment of pixel array 102 is a two-dimensional ("2D") array of imaging sensors or pixel cells 110 (e.g., pixel cells P1, P2, Pn). In one example, each pixel cell includes one or more subpixels or pixel regions that can be used for imaging in accordance with technologies and methodologies of the present disclosure. As illustrated, each pixel cell 110 is arranged into a row (e.g., rows R1 to Ry) and a column (e.g., columns C1 to Cx) to acquire image data of a person, place or object, etc., which can then be used to render an image of the person, place or object, etc. As will be described in greater detail below, each pixel cell 110 (e.g., pixel cells P1, P2, . . . , Pn) may include, for example, an isolated pixel transistor channel for providing reduced diffusion leakage in a pixel cell in accordance with technologies and methodologies of the present disclosure In one example, after each pixel cell 110 has acquired its image data or image charge, the image data is read out by readout circuitry 104 through readout column bitlines 112 and then transferred to function logic 106. In various examples, readout circuitry 104 may include amplification circuitry (not illustrated), a column readout circuit that includes analog-to-digital conversion (ADC) circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For instance, in one example control circuitry 108 generates the transfer gate signals and other control signals to control the transfer and readout of image data from the subpixels or pixel regions of the shared pixel cell 110 of pixel array 102. In addition, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In one example, the control circuitry 108 may control the timing of various control signals provided to the pixel cell 110 to reduce the dark current associated with floating diffusions of each of the pixel cells 110. The pixel cells 110, in some non-limiting embodiments, may be what are known as 4 T pixel cells, e.g., four-transistor pixel cells. In other non-limiting embodiments, the pixel cells 110 may be what are known as 5 T pixel cells, e.g., five-transistor pixel cells, including a 5 T pixel cell having a LOFIC architecture. For example, the pixel cells 110 in some non-limiting embodiments may further include a dual floating diffusion (DFD) transistor and an associated capacitor (e.g., LOFIC). The associated capacitor may be selectively coupled via the dual floating diffusion transistor to increase/decrease the capacitance of the floating diffusion, which can modulate conversion gains. In some other non-limiting embodiments, the pixel cells, regardless of transistor number (e.g., 3, 4, 5, etc.), are of the shared pixel type.

In one example, image sensor 100 may be included in a digital camera, cell phone, laptop computer, or the like. Additionally, image sensor 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor 100, extract image data from image sensor 100, or manipulate image data supplied by image sensor 100.

Figure 2A:
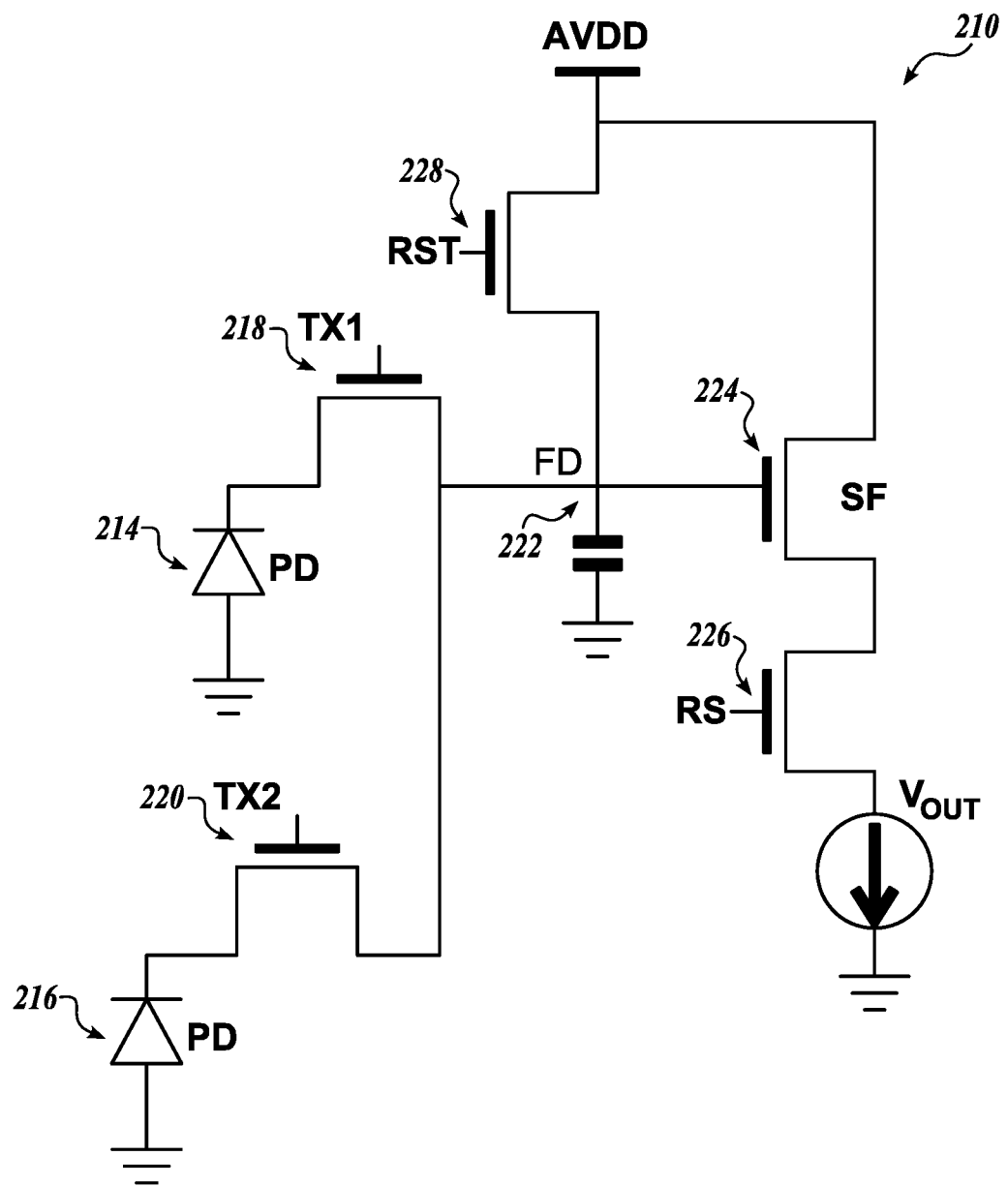
FIGS. 2A and 2B are illustrative schematics of examples of a pixel cell in accordance with embodiments of the present disclosure.

FIG. 2A is an illustrative schematic of an example pixel cell 210 in accordance with the teachings of the present disclosure. However, it should be appreciated that embodiments of the present disclosure are not limited to the pixel architecture of FIG. 2A; rather, one of ordinary skill in the art having the benefit of the instant disclosure will understand that the present teachings are also applicable to 3 T designs, 5 T designs, shared and non-shared pixel design and various other pixel architectures.

It is appreciated that pixel cell 210 of FIG. 2A may be an example of a pixel cell 110 of FIG. 1, and that similarly named and numbered elements referenced below may be coupled and function similar to as described above. For example, the pixel cell 210 may be coupled to a bitline, e.g., readout column, which may provide image data to readout circuitry, such as the readout circuitry 104, and the pixel cell 210 may receive control signals from control circuitry, such as control circuitry 108, to control the operation of the various transistors of the pixel cell 210. The control circuitry may control the operation of the transistors in desired sequences with relative timing in order to reset the pixel to a dark state, for example, and to read out image data after an integration, for example.

The illustrated example of the pixel cell 210 includes a photoelectric conversion element, such as first photodiode 214, and a second photoelectric conversion element, such as second photodiode 216. In operation, the first and second photodiodes 214, 216 are coupled to photogenerate image charge in response to incident light. In an embodiment, the first and second photodiodes 214 and 216 can be used to provide image data for a high dynamic range (HDR) image, for example.

Pixel cell 210 also includes a first transfer gate 218 of a first transistor, a second transfer gate 220 of a second transistor, and a floating diffusion 222 disposed between the first and second transfer gates 218, 220. First transfer gate 218 of the first transistor is coupled to transfer image charge from first photodiode 214 (functioned as source of the first transistor) to the floating diffusion 222 (functioned as drain of the first transistor) in response to a first transfer gate signal TX1. Second transfer gate 220 of the second transfer transistor is coupled to transfer image charge from second photodiode 216 (functioned as source of the second transistor) to the floating diffusion 222 (also functioned as drain of the second transistor) in response to a second transfer gate signal TX2. In the depicted arrangement, the floating diffusion 222 is common to both the first and second photodiodes 214, 216, and can be referred to as a common floating diffusion 222.

A reset transistor 228 is coupled to the common floating diffusion 222 to reset the pixel cell 210 (e.g., discharge or charge the first and second photodiodes 214, 216, and the floating diffusion 222 to a preset voltage) in response to a reset signal RST. The gate terminal of an amplifier transistor 224 is also coupled to the floating diffusion 222 to generate an image data signal in response to the image charge in the floating diffusion 222. In the illustrated example, the amplifier transistor 224 is coupled as a source-follower (SF) coupled transistor. A row select transistor 226 is coupled to the amplifier transistor SF 224 to output the image data signal to an output bitline, which is coupled to readout circuitry such as readout circuitry 104 of FIG. 1, in response to a row select signal RS.

Control signals TX1 and TX2 enable the transfer gates 218, 220 to transfer the charges from the photodiodes 214, 216 to the floating diffusion 222. The amount of charges transferred from the photodiodes to the floating diffusion 222 may depend on a current operation of the pixel cell 210. For example, during a reset operation, the charge may be charge generated in a dark state of the photodiode(s), but during an integration, the charge may be photogenerated image charge. At the end of an integration, the image charge may be readout twice with one or more dark readings occurring between the two to perform correlated double sampling (CDS).

Figure 2B:
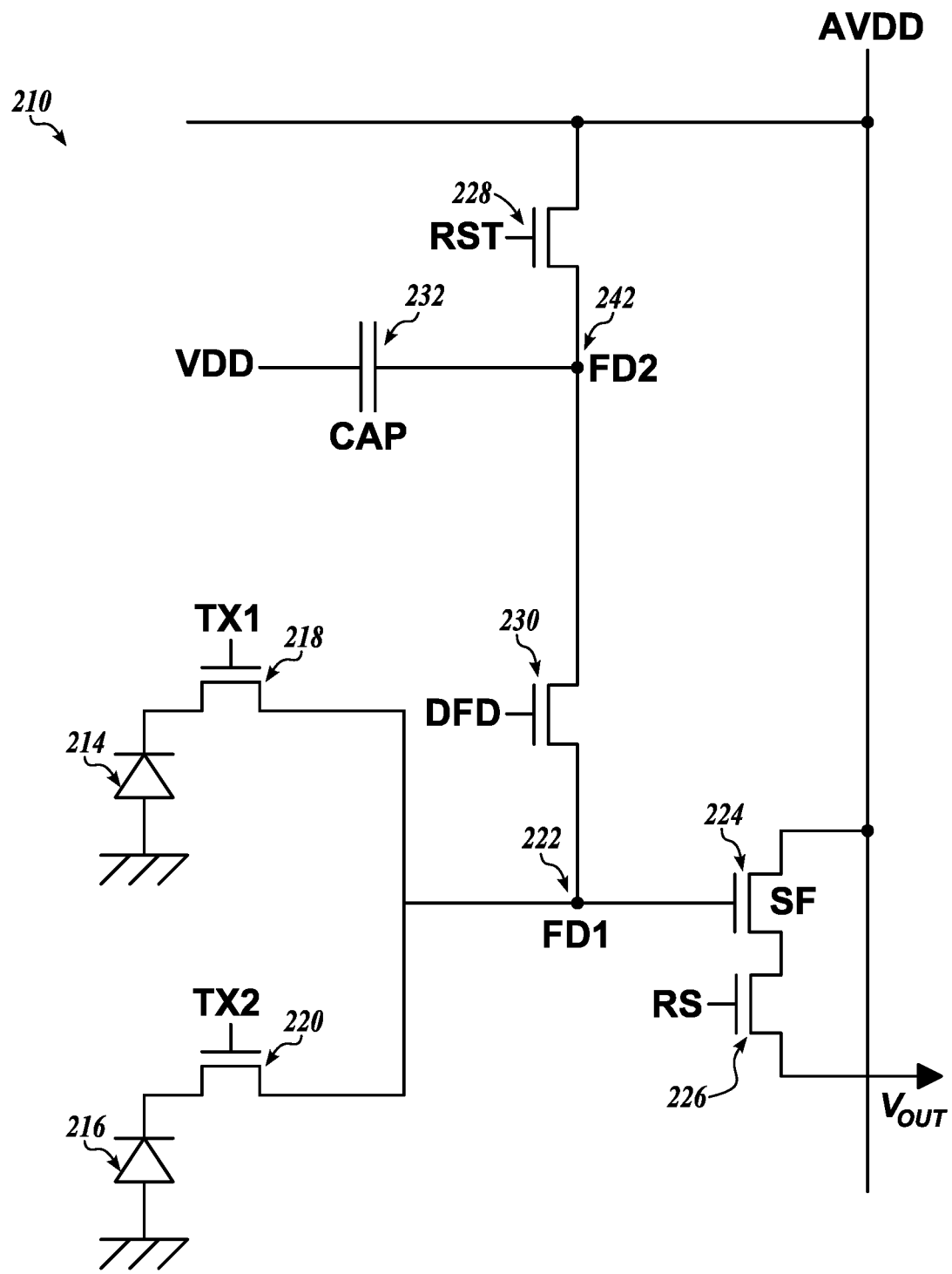

In another example embodiment of the pixel cell 210 shown in FIG. 2B, a dual floating diffusion transistor 230 may be optionally coupled between the floating diffusion 222 and the reset transistor 228. A capacitor (CAP) 232, such as a LOFIC, also may be optionally included and coupled to the dual floating diffusion transistor 230 to form a LOFIC pixel cell. When included, a second floating diffusion (FD2) 242 is formed between the reset transistor 228 and the dual floating diffusion transistor 230. In operation, the dual floating diffusion transistor 230 is adapted to couple the capacitor 232 to the floating diffusion 222 in response to a dual floating diffusion signal DFD to provide additional dynamic range capabilities to the pixel cell 210 if desired. In the depicted arrangement, the capacitor 232 is also coupled to a voltage, such as voltage VDD.

Figure 3:
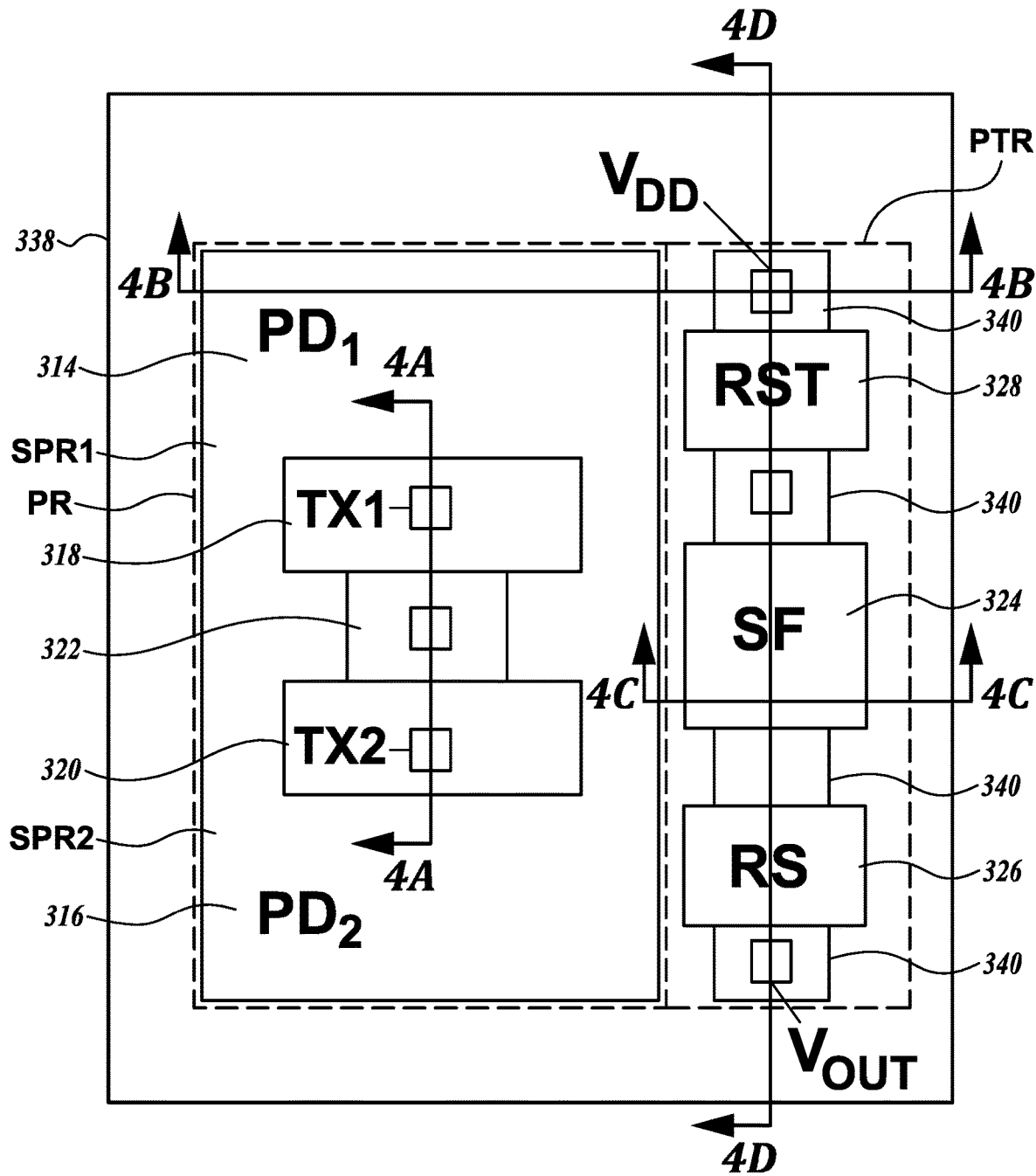
FIG. 3 is a top schematic partial view of one example of a pixel cell in accordance with an embodiment of the present disclosure.

FIG. 3 is a layout schematic view, or top schematic view, of an example pixel cell 310 in accordance with technologies and methodologies of the present disclosure. It is appreciated that the pixel cell 310 of FIG. 3 may be an example of pixel cell 210 of FIG. 2A or 2B, or an example of pixel cell 110 of FIG. 1, and that similarly named and numbered elements referenced below may be coupled and function similar to as described above. In an example embodiment, a plurality of pixel cells 310 can be arranged in rows and columns to form a pixel array suitable for use in an image sensor, for example.

As shown in the example depicted in FIG. 3, pixel cell 310 includes a pixel region PR, composed of one or more subpixel regions, and a pixel transistor region PTR. Embodiments of the pixel cell 310 that include more than one subpixel region "share" the pixel transistor region PTR, and thus, can be referred to as a shared pixel cell. While the embodiment shown includes two subpixel regions, SPR1, SPR2, the pixel cell 310 can include more (or less) subpixel regions in other embodiments.

As shown in the example depicted in FIG. 3, the pixel region PR of the pixel cell 310 includes first and second subpixel regions SPR1, SPR2, also referred to as subpixels. The first and second subpixel regions SPR1, SPR2 include respective first and second photosensitive elements, such as photodiodes (PD) 314, 316. The first and second photodiodes 314, 316 are formed or otherwise disposed in a semiconductor material 338. The semiconductor material 338 in example embodiments comprise a silicon on insulator (SOI) wafer or substrate. In some example embodiments, the silicon on insulator (SOI) wafer is a fully depleted silicon on insulator (FDSOI) wafer.

In operation, the first and second photodiodes 314, 316 are adapted to photogenerate image charge in response to incident light. In one example embodiment, the first and second photodiodes 314, 316 are N-type pinned photodiodes (NPPDs). As illustrated in the depicted example, the first and second photodiodes 314, 316 can be coupled to a common floating diffusion (FD) 322 via first and second transfer gates 318, 320 of first and second transfer transistors, respectively. For example, the first transfer gate 318 is coupled to transfer the image charge from the first photodiode 314 to the common floating diffusion 322 in response to a first transfer gate signal TX1. The second transfer gate 320 is coupled to transfer the image charge from the second photodiode 316 to the floating diffusion 322 in response to a second transfer gate signal TX2.

Still referring to the example depicted in FIG. 3, the pixel transistor region PTR of pixel cell 310 is positioned adjacent the first and second subpixel regions SPR1 and SPR2. In some embodiments as will be described below, the pixel transistor region PTR can overlap with portions of the subpixel regions SPR1 and SPR2. Within the pixel transistor region PTR, the pixel cell 310 includes gate electrodes and doped regions (i.e., drain and source) for a reset transistor (RST), an amplifier transistor acting as a source-follower (SF), and a row select transistor (RS). For example, as shown in the embodiment depicted in FIG. 3, a plurality of transistor gates, including amplifier transistor (SF) gate 324, row select (RS) gate 326, and reset transistor (RST) gate 328 are formed or otherwise disposed on the semiconductor material 338. The associated source/drain regions 340 are formed or otherwise disposed in the semiconductor material 338.

As shown in the example depicted in FIG. 3, contacts are provided on each transfer gate 318, 320 of the pixel region PR for transmission of TX1, TX2 signals. Contacts (not shown) are also formed on each transistor gate of the pixel transistor region PTR for transmission of RST and RS signals. Contacts are also provided on various source/drains 340 for coupling to a voltage, such as voltage VDD, or to output a signal, such as voltage Vout. Other contacts may be provided on one or more source/drains 340 for coupling to, for example, the FD contact of the floating diffusion 322.

As will be described in more detail below, a variety of materials and fabrication techniques may be utilized to form the pixel cell 310. The semiconductor substrate or material 338 may have a composition of silicon. The gates may have a composition including tungsten or polycrystalline silicon. Dielectric layers (not shown) may have a composition of $SiO_2$, $HfO_2$, or any other suitable dielectric medium known by one of ordinary skill in the art. Contacts may be constructed of any doped material with low ohmic resistance. Other metals, semiconductors, and insulating materials may also be utilized for pixel cell 310, as known by one of ordinary skill in the art. Doped regions of the semiconductor material may be formed by diffusion, implantation, and the like. It will be appreciated that the doping polarities or doping types (P-type, N-type, etc.) in the illustrative embodiments may be reversed in alternative embodiments. Fabrication techniques such as photolithography, masking, chemical etching, ion implantation, thermal evaporation, chemical vapor deposition, sputtering, and the like, as known by one of ordinary skill in the art, may be utilized to fabricate the pixel cell 310, the pixel array 202, and/or the image sensor 100.

FIGS. 4A-4D are cross-section views of a portion of a pixel cell, such as pixel cell 310, taken along lines 4A-4A, 4B-4B, 4C-4C and 4D-4D, respectively, of FIG. 3. The following discussion begins with FIG. 4A, which depicts a longitudinal cross section of the pixel cell 310 through the pixel region PR. As shown in the example depicted in FIG. 4A, the pixel region is formed or otherwise disposed in part in a semiconductor material 338 having a first surface 354 (e.g., front side 354) and a second surface 356 (e.g., back side 356). In an example embodiment, the semiconductor material 338 is a silicon on insulator (SOI) wafer, such as a fully depleted silicon on insulator (FDSOI) wafer. In one embodiment, the first surface 354 may be referred to as non-illuminated surface, and the second surface 356 may be referred to as an illuminated surface. In such an embodiment, individual photodiodes photogenerate charge in response to incident light entered through the second surface 356.

As shown in the example embodiment, pixel cell 310 includes a first transfer gate 318 of a first transistor, a second transfer gate 320 of a second transistor laterally spaced apart from the first transfer gate 318 of the first transistor, a floating diffusion 322 disposed in-between the first and second transfer gates 318, 320, and a doped well region 374 in surrounding relationship to the floating diffusion 322. Each of the transfer gates 318, 320, the floating diffusion 322, and the doped well region 374 are formed or otherwise disposed proximate the front side 354 of semiconductor material 338. The doped well region 374 has a first conductive type that is inversely of (or opposite to) a second conductive type of the floating diffusion region 322.

The pixel cell 310 also includes (P) pinning layers 360, 366, first and second photosensitive elements or regions 362, 364 and 368, 370 (e.g. photodiode regions), all disposed or otherwise formed in the semiconductor material 338. Pinning layers 360, 366 are disposed above photosensitive regions 362, 368 and adjacent the first and second transfer gates 318, 320, respectively. Photosensitive regions 362, 368 are shallow photodiode (SPD) regions that have a conductive type (e.g., second conductive type) inversely of the pinned layers 360, 366 having the first conductive type. Disposed directly beneath photosensitive regions 362, 368 are photosensitive regions 364, 370, which are deep photodiode (DPD) regions that also have a conductive type (e.g., second conductive type) inversely of the pinned layers 360, 366. Together, the pinning layers 360, 366, and the first and second photosensitive regions 362, 364 and 368, 370 form first and second photodiodes 314, 316, respectively.

The first and second photosensitive regions 362, 364 and 368, 370 have a conductive type that is also inversely of the doped well region 374. The first and second photosensitive regions 362, 364 and 368, 370 are formed in the base silicon layer of the silicon on insulator (SOI) wafer. In an example embodiment, the first and second photodiodes are n-type pinned photodiode (NPPD). In an example embodiment, the photosensitive regions 362, 368 have been doped heavier (e.g., have more impurities) than the photosensitive regions 364, 370. In an example embodiment, the photosensitive regions 362, 368 can be implanted with a dosage level of $1E12/cm^{-2}$ and the photosensitive regions 364, 370 can be implanted with a dosage level of $1E11/cm^{-2}$.

In an example embodiment, the doped well region 374 is a (P) doped well region (PW) 374, sometimes referred herein as a P-well region 374. The P-well region 374 is also formed in the base silicon layer of the silicon on insulator (SOI) wafer and positioned in-between the first and second photodiodes 314, 316. In an example embodiment, the P-well 374 can be implanted inversely of the photosensitive regions with a dosage level of $1E12/cm^{-2}$. In an example embodiment, the P-type doped well region 374 is grounded.

Figure 4A:
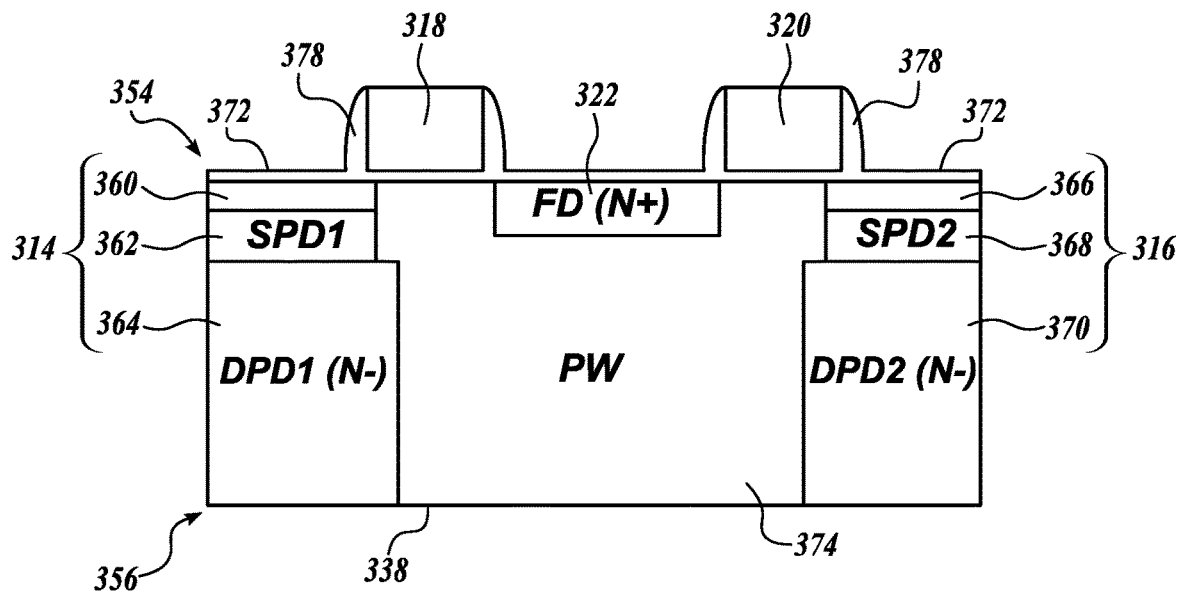
FIGS. 4A-4D are schematic cross sectional views of the pixel array of FIG. 3, taken along lines A-A, B-B, and C-C, D-D respectively.

In the example depicted in FIG. 4A, a thin oxide layer, such as thin oxide layer 372, is disposed over the front side 354 of the semiconductor material 338. In that regard, the thin oxide layer 372 is disposed over the pinned layers 360, 362 and the floating diffusion 322, and in-between the transfer gates 318, 320 and the P-well region 374. As such, the thin oxide layer 372 separates the transfer gates 318, 320 from the floating diffusion 322 and from the P-well region 374.

The transfer gates 318, 320 of the transfer transistors may also be separated from other components of the pixel cell 310 via gate sidewall spacers 378. For example, gate sidewall spacers 378 can be positioned adjacent the inner and outer sidewall surfaces, respectively, of the transfer gates 318, 320. In some example embodiments, the gate sidewall spacers 378 may be bulk silicon nitride spacers or may be constructed out of film layers of silicon oxide, silicon nitride, etc. and/or combinations thereof. In some example embodiments, the first and second gate sidewall spacers 378 are directly adjacent (e.g., abut against) the sidewall surfaces of the transfer gates 318, 320. Other embodiments are contemplated wherein the gate sidewall spacers 378 include other different layers or materials in addition to or in place of the bulk nitride spacers and/or the gate oxide layer.

Figure 5:
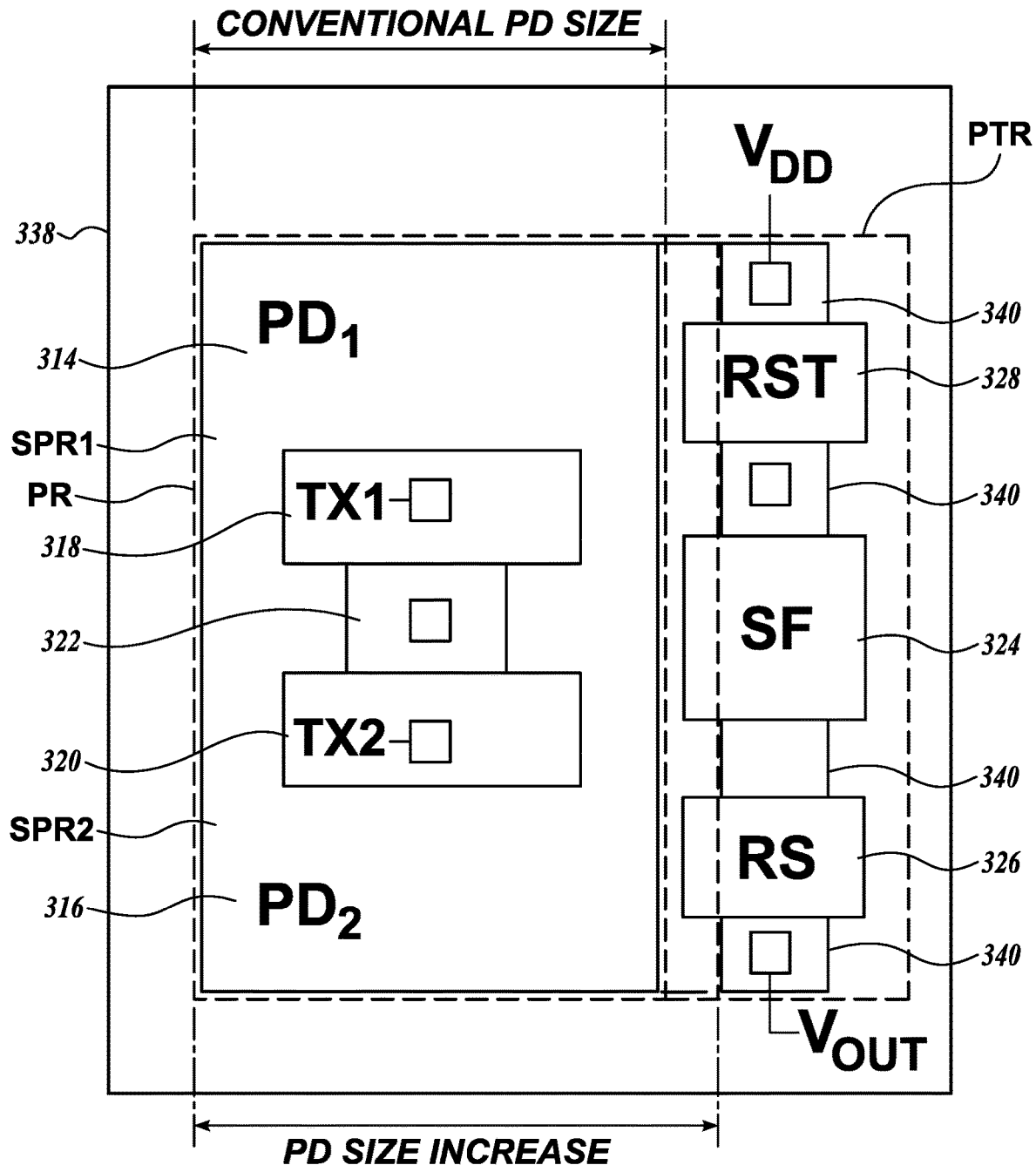
FIG. 5 is an illustrative schematic depicting an increase in size of the photodiode region of a pixel cell in accordance with an aspect of the present disclosure as compared to the size of the photodiode region in a conventional pixel cell.

As well be described in more detail below, the configuration of the pixel transistor region PTR allows for the omission of any trench isolation structure and/or isolation implant regions to provide electrical isolation. As such, the photodiode regions of the pixel cell 310 can be enlarged as compared to a convention pixel cell, as schematically depicted in FIG. 5.

Figure 4B:
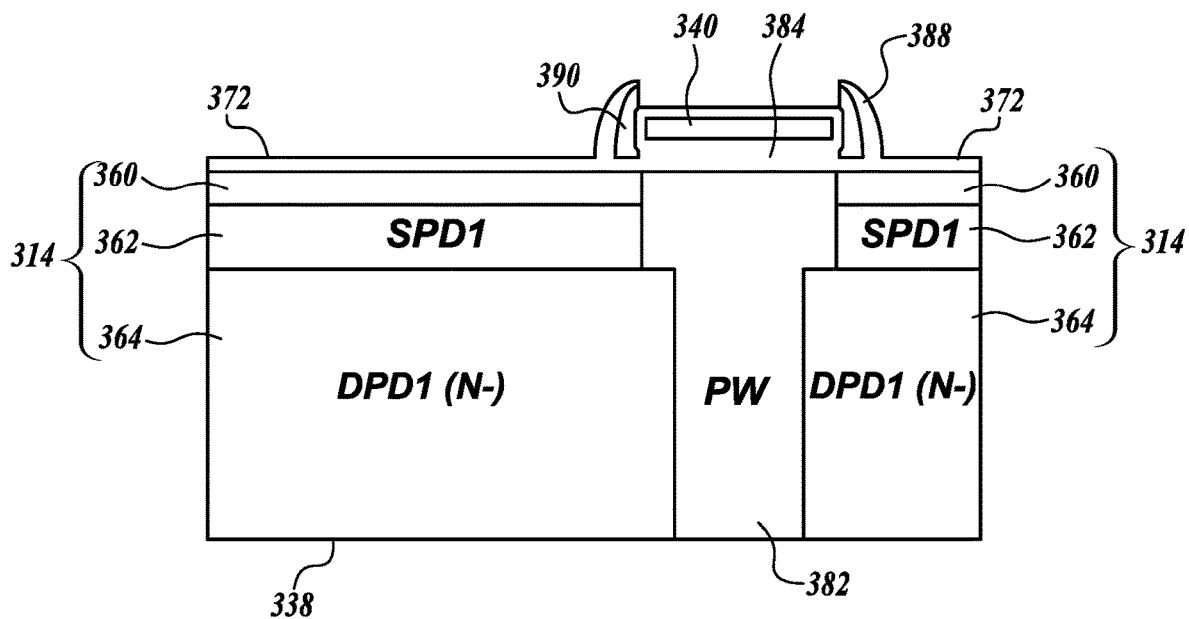
Figure 4C:
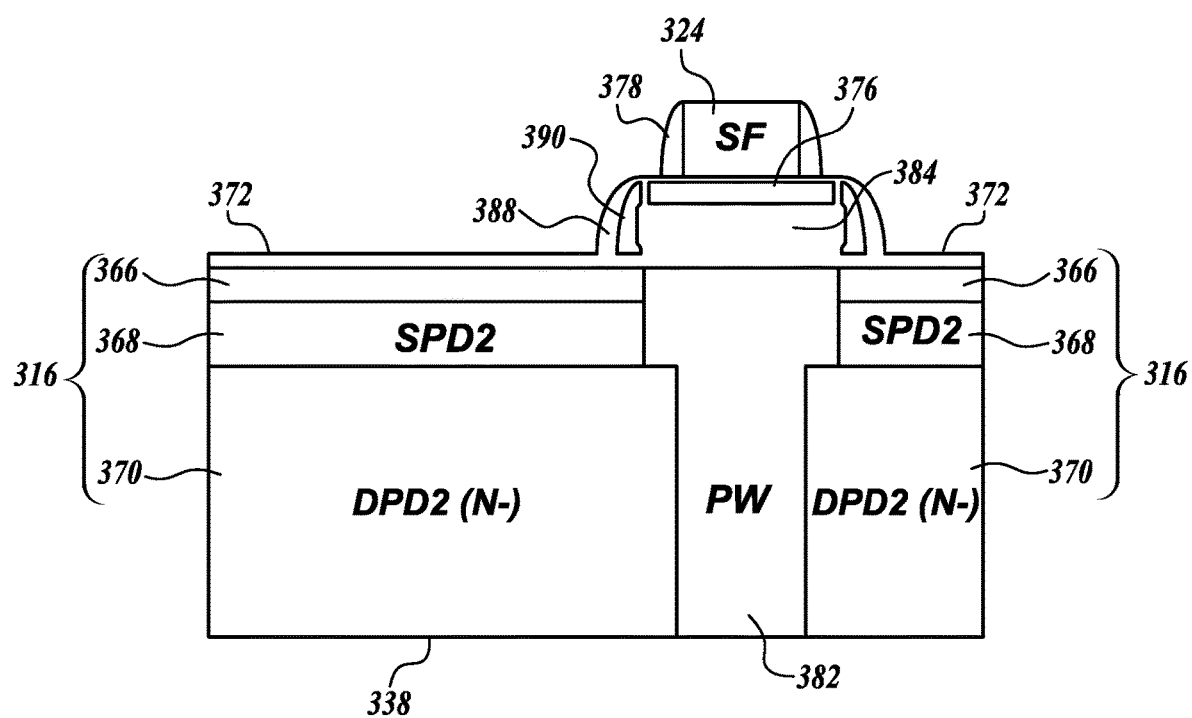
Figure 4D:
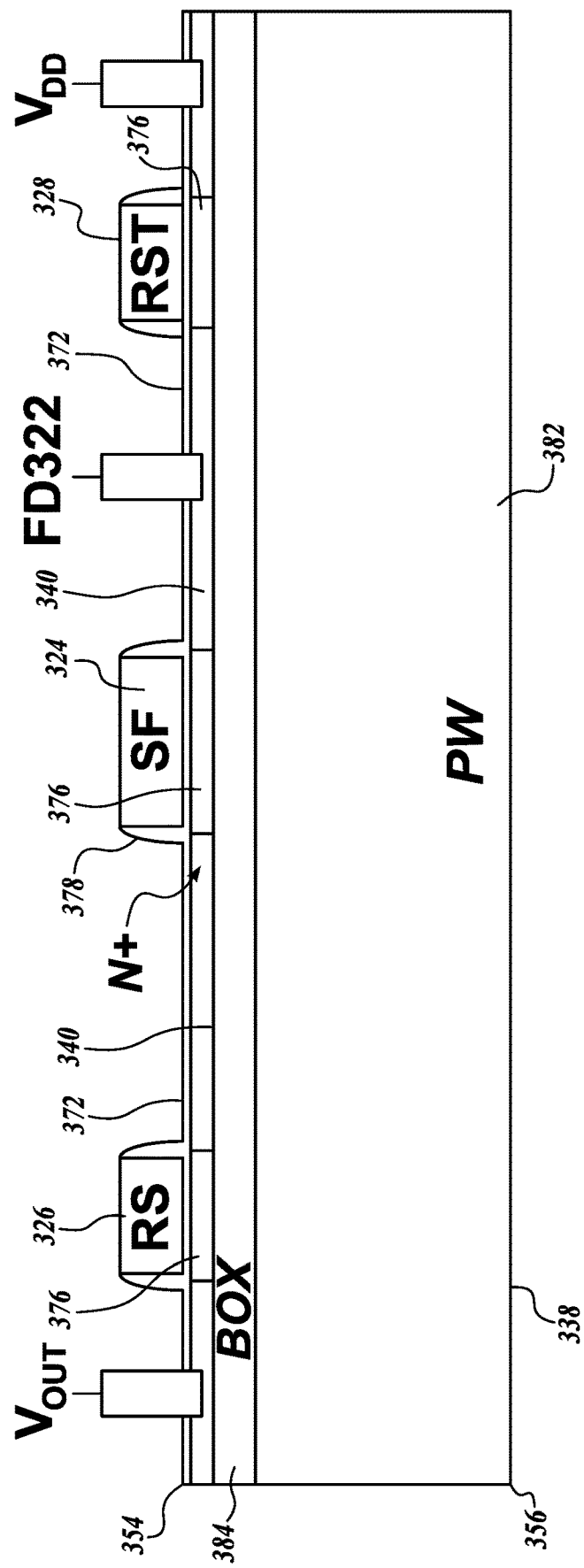

The pixel transistor region PTR of pixel cell 310 will now be described with reference to FIGS. 4B, 4C, 4D. FIG. 4B is a lateral cross-section view of the pixel cell 310 through a source/drain region 340 associated with voltage line $V_{DD}$ of the pixel transistor region PTR of FIG. 3. As such, FIG. 4D depicts a cross sectional view across the pixel transistor region PTR of pixel cell 310, which is disposed adjacent subpixel region PD1 of pixel cell 310, e.g., along the channel direction of the transistors. FIG. 4C is a lateral cross-section view of the pixel cell 310 through the amplifier transistor (e.g., source follower (SF)) of the pixel transistor region PTR of FIG. 3, e.g., along the gate width direction of amplifier transistor. As such, FIG. 4C depicts a cross sectional view across the pixel transistor region PTR of pixel cell 310, which is disposed adjacent subpixel region PD2 of pixel cell 310. FIG. 4D is a longitudinal cross-section view of the pixel cell 310 along the transistor channel length direction of the pixel transistor region PTR of FIG. 3.

As shown in the example depicted in FIGS. 4B, 4C, 4D, the pixel transistor region PTR of pixel cell 310 includes a plurality of transistor gates, including amplifier transistor gate 324, row select gate 326, and reset transistor gate 328, as well as source/drain regions 340. In other embodiments with a LOFIC architecture, a dual floating diffusion transistor gate will also be included in the pixel transistor region PTR and disposed between reset transistor gate 328 and the source/drain region 340 that is coupled to floating diffusion 322. These transistor gates and source/drains are formed or otherwise disposed proximate the front side 354 of the semiconductor material 338, which is a fully depleted silicon on insulator (FDSOI) wafer in the depicted embodiment.

Generally described, the fully depleted silicon on insulator (FDSOI) wafer includes a thin top silicon layer (e.g., top SOI layer), a thin intermediate or buried oxide (BOX) layer 384 and a base silicon layer that was referenced above with regard to the pixel region PR. In the embodiment illustrated in FIGS. 4B, 4C, 4D, the base silicon layer associated with the pixel transistor region PTR is implanted or otherwise doped to form a doped well region 382, such as a (P) doped well region (PW) or P-well region 382. The buried oxide layer 384 separates the P-well region 382 from the top SOI layer. In some embodiments, P-well region 382 is also grounded to provide reference voltage to the transistors.

In an example embodiment, the P-well region 382 extends depthwise from the buried oxide layer 384 to the backside 356 of the semiconductor material 338 providing isolation between first and second photodiodes 314, 316. The P-well region 382 is positioned between the photodiodes (SPD regions, DPD regions, pinned layers, etc.) of adjacent pixel cells (in the X-direction) and extends the length (Y-direction) of the pixel transistor region PTR of pixel cell 310. In the example depicted in FIGS. 4B, 4C, and 4D, the edge areas of the photodiode regions, such as photosensitive regions 362, 364 of photodiode 314 and/or photosensitive regions 368, 370 of photodiode 316 extend into the pixel transistor region PTR to a position at least partially under the transistor channel region (e.g., the source/drain regions 340). In some example embodiments, edge areas of the photodiode regions, such as photosensitive regions 362, 364 of photodiode 314 and/or photosensitive regions 368, 370 of photodiode 316, can extend to a position at least partially under (e.g., in general alignment with) one or more transistor gates of the pixel transistor region PTR. As a result, the full well capacity (FWC) of one or more of the photodiodes can increase.

In the example depicted in FIGS. 4B, 4C, 4D, the buried oxide layer 384 isolates the transistor gates 324, 326, 328 and source/drain regions 340 of the pixel transistor region PTR from the P-well region 382. In an example embodiment, the buried oxide layer 384 has a thickness of about 25 nm to about 50 nm.

In the example embodiment depicted in FIGS. 4B, 4C, 4D, the transistor gates, such as transistor gates 324, 326, 328, are disposed on the top SOI layer of the fully depleted silicon on insulator (FDSOI) wafer. Directly beneath each transistor gate are fully depleted channels or undoped regions or undoped channel regions 376 of the top SOI layer formed from a floating well of conductive type opposite the source/drain regions of the transistors, such as a P-type well having floating potential, as depicted in FIG. 4C, 4D. In an example embodiment, the undoped region 376 associated with the row select transistor gate 326 may be implanted (lightly) for threshold voltage ($V_{th}$) adjustment purposes.

Adjacent each side of regions 376 in the top SOI layer there are formed source/drain regions 340, as depicted in FIG. 4B, 4D. The source/drain regions 340 can be implanted regions of a conductive type inversely of the (P) doped well region 382 for forming N-channel MOS transistors. In an example embodiment, the source/drain regions 340 are heavy (N+) doped regions. In one example embodiment, the sources/drain regions 340 and undoped regions 376 of the pixel transistor region PTR are generally aligned to form a transistor channel region, such as a (N) channel region, having a length direction corresponding to the Y-direction of the semiconductor material 338. In an example embodiment, the top SOI layer, e.g., the source/drain regions 340 and the regions 376, has a thickness of about 5 nm to about 15 nm, and about 6 nm to about 8 nm in some embodiments.

In the example depicted in FIGS. 4B, 4C, 4D, a thin oxide layer, such as thin oxide layer 372, is disposed over the front side 354 of the pixel transistor region PTR of semiconductor material 338. In that regard, the thin oxide layer 372 is disposed entirely over the top SOI layer of the pixel transistor region PTR in order to separate, for example, the transistor gates 324, 326, 328 from the source/drain regions 340 and the undoped regions 376. The transistor gates 324, 326, 328 may also be separated from other components of the pixel cell 310 via gate sidewall spacers. For example, gate sidewall spacers 378 can be positioned adjacent the inner and outer sidewall surfaces, respectively, of the transistor gates 324, 326, 328. In some embodiments, gate sidewall spacers 378 can be used for alignment purposes during ion-implanting process for forming source/drain regions of the transistors.

In the example depicted in FIGS. 4B, 4C, 4D, the buried oxide layer 384 and the top SOI layer of the pixel transistor region PTR may also be separated from other components of the pixel cell 310 via sidewall spacers. For example, sidewall spacers can be positioned adjacent sidewalls of the buried oxide layer 384 and/or the top SOI layer. In the example depicted in FIGS. 4B, 4C, 4D, each sidewall spacer is formed by an outer film layer 388 and an inner bulk section 390. In an example embodiment, the outer film layer 388 can be constructed out of film layers of silicon oxide, silicon nitride, etc. and/or combinations thereof, and inner bulk section 390 can be a bulk poly-silicon, for example. In some example embodiments, an oxide film layer separates the inner bulk sections 390 from the buried oxide layer 384 and/or the top SOI layer. Other embodiments are contemplated wherein the sidewall spacers include other different layers or materials in addition to or in place of the bulk poly-silicon spacers and/or the oxide layer.

In summary, in accordance with technologies and methodologies of the disclosure the buried oxide layer 384 of the fully depleted silicon on insulator (FDSOI) wafer isolates the transistor channel region (formed in the top SOI layer) from the photodiodes of the pixel region PR of the pixel cell 310 or from adjacent pixel cells in a pixel array. Isolating the transistor channel region (e.g., N-channel region) eliminates the junction leakage path of the pixel cell, thus leading to a reduction in diffusion leakage and an increase in device operation speed.

Isolating the transistor channel region (e.g., N-channel region) with the buried oxide layer allows for the isolation structure (e.g., the shallow isolation trench (STI) structure, the heavy doped (P+) isolation implant region, etc.) typically disposed adjacent the photodiode regions of currently available pixel cells to be disregarded (e.g., omitted) in embodiments of the present disclosure. Without the need for such isolation structure, the space normally occupied by these isolation components can be utilized by larger photodiode areas, leading to an increase in full well capacity (FWC) for high resolution imaging. Such an increase is schematically illustrated in the embodiment of FIG. 5.

The absence of the (P+) isolation implant also improves image lag by avoiding the photodiode potential neck (i.e., the higher potential barrier between the photodiode and the transfer channel) caused by such (P+) isolation implants. In addition, removal of the shallow isolation trench (STI) structure can reduce dark-current significantly, especially in small pixel cells. Use of the fully depleted silicon on insulator (FDSOI) technology also reduces or potentially eliminates junction-capacitance of the pixel transistor region, which can increase spread-out speed by reducing resistor capacitor (RC) delay. And the reduced junction-leakage current at the floating diffusion junction can significantly reduce floating diffusion junction-leakage induced dark-current in a LOFIC pixel cell.

As was described briefly above, methods are contemplated for suppressing diffusion junction leakage in CMOS image sensors. In that regard, methods for reducing diffusion leakage in a pixel cell are provided. In an example embodiment, the pixel cell is formed with a fully depleted silicon on insulator (FDSOI) substrate having a buried oxide layer that separates a top (e.g., silicon) layer from a base (e.g., silicon) layer. The pixel cell has a pixel region with at least one photosensitive element and a pixel transistor region disposed adjacent the pixel region. The pixel transistor region comprises a transistor channel.

A method, in an embodiment, comprises isolating the transistor channel of the pixel transistor region from the pixel region with the buried oxide layer. In an embodiment, the method further includes forming the channel region of the pixel transistor region with the top layer of the fully depleted silicon on insulator (FDSOI) substrate. In some example embodiments, the method further comprises adjusting a threshold voltage of one transistor of the pixel transistor region.

In some example embodiments of the method, the channel region includes a plurality of doped source/drain regions separated by undoped regions. In an example embodiment, the pixel cell further includes a plurality of transistor gates formed on the top layer of the fully depleted silicon on insulator (FDSOI) substrate, wherein each of the undoped regions are disposed beneath a respective transistor gate. In some example embodiments of the method, the pixel cell is absent of isolation structure between the pixel region and the pixel transistor region. In some of these embodiments, the isolation structure is a trench isolation structure or an isolation implant region.

In an embodiment, the plurality of transistor gates includes a row select transistor gate. In this embodiment, the method further includes implanting impurities into one undoped region associated with the row select transistor gate for adjusting the threshold voltage of the row select transistor gate.

Figure 6:
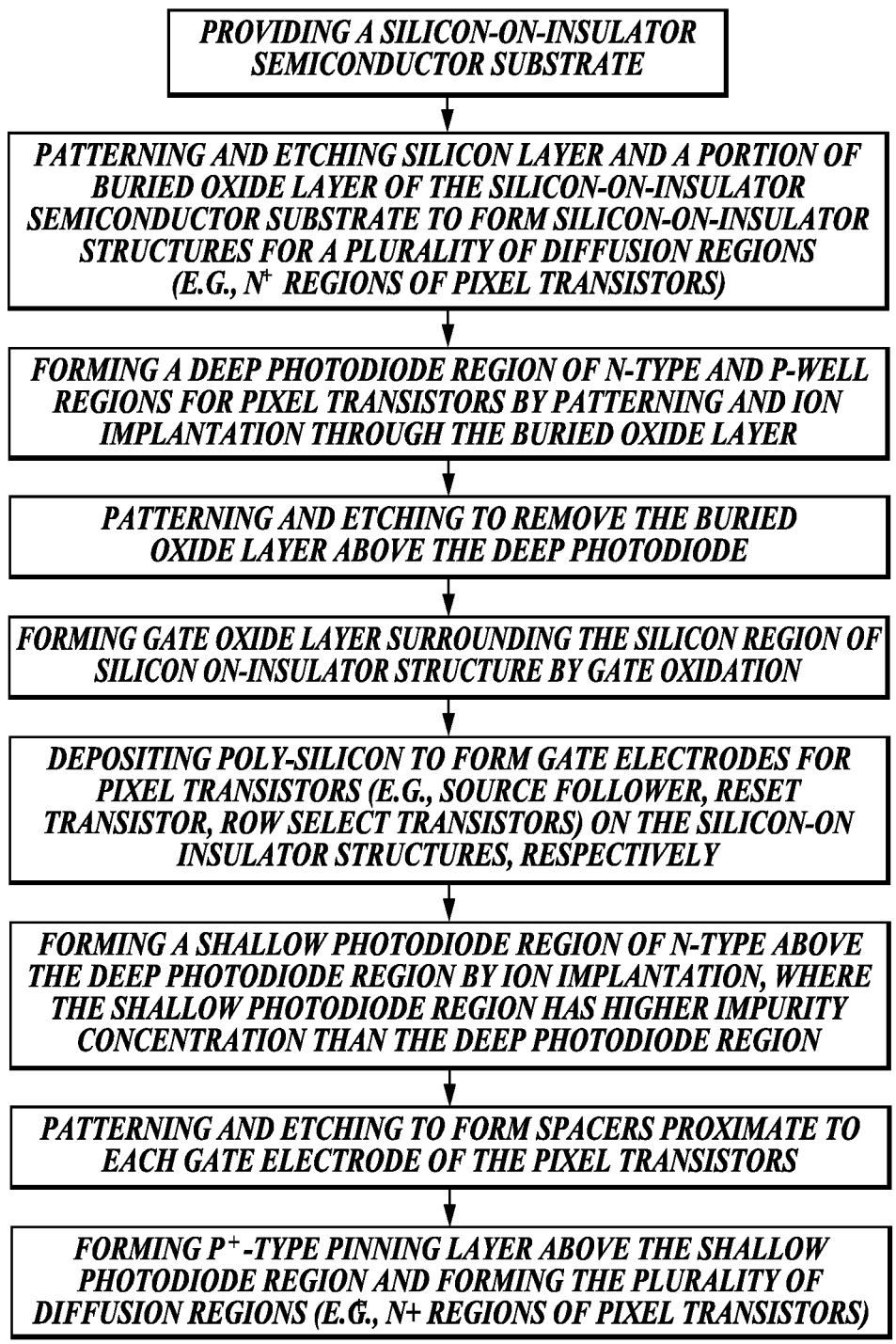
FIG. 6 is an example flow chart for fabricating a pixel cell in accordance with an embodiment of the present disclosure.

FIG. 6 is a flow chart illustrating one example of a method for fabricating a pixel cell, such as pixel cell 310, in accordance with the teachings of the present disclosure. It will be appreciated that the following method steps can be carried out in any order or at the same time, unless an order is set forth in an express manner or understood in view of the context of the various operation(s). Additional process steps can also be carried out, including chemical-mechanical polishing, masking, additional doping, etc. Of course, some of the method steps can be combined or omitted in example embodiments.

Referring now to FIG. 6, a method for fabricating a pixel cell that reduces junction leakage will be described in more detail. The following fabrication methodology may also provide a pixel cell with an increased full well capacity as compared to conventional pixel cells. The pixel cell to be fabricated includes a pixel region PR and a pixel transistor region PTR.

The pixel region PR to be formed will include one or more photosensitive regions adapted to accumulate image charge photogenerated in the photosensitive region in response to incident light, one or more transfer gates, and floating diffusion region. The one or more transfer gates, such as transfer gate 318 and/or transfer gate 320, can be coupled to transfer the image charge from an associated photosensitive region, such as photodiode(s) 314, 316, to the floating diffusion, such as floating diffusion 322, in response to transfer gate signal(s).

The pixel transistor region PTR to be formed will include a plurality of transistor gates, such as transistor gates 324, 326, 328, and a plurality of source/drain regions, such as source/drain regions 340, separated by channel regions, such as undoped regions 376. The source/drain regions 340 and channel regions 376 together form the transistor channel region (e.g., N channel region) of the pixel transistor region PTR. In an example embodiment, the length direction of the transistor channel region can be arranged along the Y-direction of the pixel transistor region PTR. The pixel transistor region PTR will also include a buried oxide layer, such as buried oxide layer 384, disposed directly beneath the transistor channel region of the pixel transistor region PTR for isolation purposes.

As shown in the example of FIG. 6, the method begins with providing a silicon-on-insulator semiconductor substrate, such as a fully depleted silicon-on-insulator (FDSOI) substrate. The fully depleted silicon-on-insulator (FDSOI) substrate includes a top SOI layer, a base silicon layer, and a buried oxide layer in-between the top SOI layer and the base silicon layer. In an embodiment, the top SOI layer has a thickness of about 5 nm to about 15 nm and the buried oxide layer has a thickness of about 25 nm to about 50 nm.

Next, the top SOI layer and a portion of (e.g., thickness of) the buried oxide layer associated with the pixel region is removed. In an example embodiment, the top SOI layer and a portion of the buried oxide layer is removed by a patterning and etching process. The remaining top SOI layer will be subsequently employed for forming silicon-on insulator structures for a plurality of diffusion regions (e.g., source/drain regions of the pixel transistors).

After the top SOI layer and a portion of the buried oxide layer are removed from the pixel region of the substrate, one or more deep photodiode regions of the N-type, such as deep photodiode region(s) 364, 370, and P-well regions, such as P-well regions 374, 382, are formed. In an example embodiment, these regions are formed by patterning and ion implantation in the base silicon layer through the buried oxide layer. Thereafter, the buried oxide layer above the deep photodiode region(s) is removed (e.g., by patterning and etching (e.g., wet etch)).

The following steps of the method, in any order, can then be carried out: forming a an oxide layer to cover the base silicon layer of the pixel region and/or surround the top SOI layer of the pixel transistor region PTR; forming gate electrodes (e.g., via poly-silicon deposition) for pixel transistors (e.g., source follower, reset transistor, row select transistor) on the top SOI layer; forming transfer gate electrodes (e.g., via poly-silicon deposition), such as transfer gates 318, 320; forming, in the base silicon layer, shallow photodiode region(s) of an N-type, such as photodiode regions 362, 368, directly above the deep photodiode regions(s) 364, 370 via ion implantation, wherein the shallow photodiode region(s) 362, 368 have a higher impurity concentration than the deep photodiode region(s) 364, 370; forming ($P^+$) pinning layer(s), such as pinning layers 360, 366, above the shallow photodiode region(s) 362, 368; and forming a plurality of diffusion regions (e.g., $N^+$ regions of the pixel transistors such as floating diffusion 322 and source/drain regions 340) via ion implantation. In an example embodiment, one of the channel regions 376, such as the undoped region 376 associated with the row select gate 326, can be implanted (lightly) for threshold voltage ($V_{th}$) adjustment purposes.

The method can also include other process steps. For example, the method may include forming spacers, such as sidewall spacers 378, 388, proximate the gate electrode for each transistor of the pixel cell 310 and proximate the remaining buried oxide layer 384, respectively. In an example embodiment, the side wall spacers 378, 388 are formed by a patterning and etching process. Other process steps, such as forming an oxide layer (e.g., oxide layers 372, 390) on any open layer can be carried out.

While example embodiments described above relate to a shared pixel cell, other architectures, such as non-shared pixel cells (e.g., one photosensitive region per pixel transistor region), may employ the methodologies and technologies of the present disclosure. Also, the present application may reference quantities and numbers. Unless specifically stated, such quantities and numbers are not to be considered restrictive, but exemplary of the possible quantities or numbers associated with the present application. Further in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The above description of illustrated examples of the present disclosure, including what is described in the Abstract, are not intended to be exhaustive or to be a limitation to the precise forms disclosed. While specific embodiments of, and examples for, the present disclosure are described herein for illustrative purposes, various equivalent modifications are possible without departing from the broader spirit and scope of the present disclosure, as claimed. Indeed, it is appreciated that the specific example voltages, currents, frequencies, power range values, times, etc., are provided for explanation purposes and that other values may also be employed in other embodiments and examples in accordance with the teachings of the present disclosure.

These modifications can be made to examples of the disclosed subject matter in light of the above detailed description. The terms used in the following claims should not be construed to limit the claimed subject matter to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell for a CMOS image sensor, comprising:
   a fully depleted silicon on insulator (FDSOI) substrate having a top layer and a buried oxide layer disposed directly beneath the top layer;
   a pixel region including a photosensitive region that accumulates image charge photogenerated in the photosensitive region in response to incident light, wherein the photosensitive region includes a pinned photodiode, comprising:
   a shallow region in a base layer of the FDSOI substrate proximate to a front side of the FDSOI substrate; and
   a deep region in the base layer of the FDSOI substrate beneath the shallow region such that the deep region is disposed between the shallow region and a backside of the FDSOI substrate; and
   a pixel transistor region disposed adjacent to the pixel region and including a transistor channel region formed in the top layer of the FDSOI substrate,
   wherein the buried oxide layer is arranged to isolate the transistor channel region from the pixel region.

2. The pixel cell of claim 1, wherein the buried oxide layer is arranged to isolate the transistor channel region from the photosensitive region of the pixel region.

3. The pixel cell of claim 1, wherein the photosensitive region extends into the pixel transistor region.

4. The method of claim 1, wherein the pixel cell is absent of an isolation structure disposed between the pixel region and the pixel transistor region.

5. The method of claim 4, wherein the isolation structure includes a trench isolation structure or an isolation implant region.

6. The pixel cell of claim 1, wherein the transistor channel region comprises a plurality of doped source and drain regions separated by undoped channel regions.

7. The pixel cell of claim 6, wherein an edge of the photosensitive region extends into the pixel transistor region to a position at least partially under the transistor channel region.

8. The pixel cell of claim 6, wherein the pixel cell further includes a plurality of transistor gates of a plurality of transistors formed on the top layer of the FDSOI substrate, wherein each of the undoped channel regions are disposed beneath a respective transistor gate.

9. The pixel cell of claim 6, wherein one undoped channel region associated with one transistor gate is implanted with impurities for adjusting the threshold voltage of said transistor gate.

10. The pixel cell of claim 8, wherein the plurality of transistor gates includes a row select transistor gate, wherein an undoped channel region associated with the row select transistor gate is implanted with impurities for adjusting the threshold voltage of the row select transistor gate.

11. The pixel cell of claim 1, wherein the buried oxide layer is more than twice as thick as the top layer.

12. The pixel cell of claim 11, wherein the top layer has a thickness of 5 nm to 15 nm, and wherein the buried oxide layer has a thickness of 25 nm to 50 nm.

13. The pixel cell of claim 1, wherein the FDSOI substrate includes a doped well region extending beneath the buried oxide layer, the doped well region having a conductivity type opposite of a corresponding conductivity type of the shallow region or the deep region of the pinned photodiode.

14. The pixel cell of claim 1, wherein the pinned photodiode included in the photosensitive region is an n-type pinned photodiode (NPPD) that includes the shallow region and the deep region.

15. The pixel cell of claim 1, wherein the pixel transistor region comprises:
a reset transistor coupled to a floating diffusion to reset the pixel cell in response to a reset signal;
an amplifier transistor having a gate coupled to the floating diffusion to generate an image data signal in response to the image charge in the floating diffusion; and
a row select transistor coupled to the amplifier transistor to output the image data signal to an output bitline in response to a row select signal.

16. The pixel cell of claim 15, further comprising:
a dual floating diffusion transistor coupled between the floating diffusion and the reset transistor; and
a capacitor coupled to the dual floating diffusion transistor, wherein the dual floating diffusion transistor is adapted to couple the capacitor to the floating diffusion in response to a dual floating diffusion signal.

17. A method for reducing diffusion leakage in a pixel cell, the pixel cell formed with a fully depleted silicon on insulator (FDSOI) substrate having a buried oxide layer that separates a top layer from a base layer, the pixel cell having a pixel region with at least one photosensitive region that accumulates image charge photogenerated in the at least one photosensitive region in response to incident light and a pixel transistor region disposed adjacent to the pixel region, the pixel transistor region comprising a transistor channel region formed in the top layer of the FDSOI substrate, the method comprising:
isolating, with the buried oxide layer, the transistor channel region of the pixel transistor region from the pixel region, wherein the at least one photosensitive region comprises:
a shallow region in a base layer of the fully depleted silicon on insulator (FDSOI) substrate proximate to a front side of the FDSOI substrate; and
a deep region in the base layer of the fully depleted silicon on insulator (FDSOI) substrate beneath the shallow region such that the deep region is disposed between the shallow region and a backside of the FDSOI substrate.

18. The method of claim 17, further comprising:
forming the transistor channel region of the pixel transistor region with the top layer of the fully depleted silicon on insulator (FDSOI) substrate.

19. The method of claim 17, wherein the transistor channel region includes a plurality of doped source/drain regions separated by undoped channel regions.

20. The method of claim 19, wherein the pixel cell further includes a plurality of transistor gates formed on the top layer of the fully depleted silicon on insulator (FDSOI) substrate, wherein each of the undoped channel regions are disposed beneath a respective transistor gate.

21. The method of claim 20, wherein the plurality of transistor gates includes a row select transistor gate, and wherein the method further comprises:
implanting impurities into an undoped channel region associated with the row select transistor gate for adjusting the threshold voltage of the row select transistor gate.

22. The method of claim 17, wherein the pixel transistor region includes a transistor, the method further comprising:
adjusting a threshold voltage of the transistor of the pixel transistor region.

23. The method of claim 17, wherein the pixel cell is absent of isolation structure between the pixel region and the pixel transistor region.

24. The method of claim 23, wherein the isolation structure is a trench isolation structure or an isolation implant region.

25. A pixel cell for a CMOS image sensor, comprising:
a fully depleted silicon on insulator (FDSOI) substrate having a top layer, a base layer, and a buried oxide layer disposed between the top layer and the base layer;
a pixel region including a photosensitive region adapted to photogenerate image charge in response to incident light, wherein the photosensitive region includes a photodiode, and wherein the photodiode includes a deep region disposed within in the base layer of the FDSOI substrate; and
a pixel transistor region disposed adjacent to the pixel region and including a transistor channel region formed in the top layer of the FDSOI substrate, wherein the buried oxide layer is disposed, at least in part, between the transistor channel region and the buried oxide layer, and
wherein the buried oxide layer is disposed, at least in part, between the transistor channel region and the deep region of the photodiode included in the photosensitive region.

26. The pixel cell of claim 25, wherein the transistor channel region comprises a plurality of doped source and drain regions separated by undoped channel regions, and wherein the buried oxide layer is disposed, at least in part, between at least one of the plurality of doped source and drain regions and the deep region.

27. The pixel cell of claim 25, wherein the buried oxide layer is adapted to isolate the transistor channel region from the pixel region.

28. The pixel cell of claim 25, wherein the photodiode further includes:
a shallow region disposed, at least in part, between a front side of the FDSOI substrate and the deep region, and wherein the front side is opposite of the backside; and
a pinning layer having a first conductivity type opposite to a second conductivity type of the shallow region, the pinning layer disposed at least in part, between a front side of the FDSOI substrate and the shallow region, and wherein the pinning layer, the shallow region, and the deep region form a pinned photodiode.

29. A pixel cell for a CMOS image sensor, comprising:
a fully depleted silicon on insulator (FDSOI) substrate having a top layer and a buried oxide layer disposed directly beneath the top layer;
a pixel region including a photosensitive region that accumulates image charge photogenerated in the photosensitive region in response to incident light;
a pixel transistor region disposed adjacent to the pixel region and including a transistor channel region formed in the top layer of the FDSOI substrate, wherein the buried oxide layer is arranged to isolate the transistor channel region from the pixel region, wherein the pixel transistor region further includes:
 a reset transistor coupled to a floating diffusion to reset the pixel cell in response to a reset signal;
 an amplifier transistor having a gate coupled to the floating diffusion to generate an image data signal in response to the image charge in the floating diffusion; and
 a row select transistor coupled to the amplifier transistor to output the image data signal to an output bitline in response to a row select signal;
a dual floating diffusion transistor coupled between the floating diffusion and the reset transistor; and
a capacitor coupled to the dual floating diffusion transistor, wherein the dual floating diffusion transistor is adapted to couple the capacitor to the floating diffusion in response to a dual floating diffusion signal.

* * * * *

UNITED STATES PATENT AND TRADEMARK OFFICE
CERTIFICATE OF CORRECTION

PATENT NO. : 11,264,419 B2  
APPLICATION NO. : 16/730756  
DATED : March 1, 2022  
INVENTOR(S) : Seong Yeol Mun Page 1 of 1

It is certified that error appears in the above-identified patent and that said Letters Patent is hereby corrected as shown below:

In the Claims

| Column | Line | Claim | |
|---|---|---|---|
| 18 | 42-44 | 25 | Remove: wherein the buried oxide layer is disposed, at least in part, between the transistor channel region and the buried oxide layer |

Signed and Sealed this  
Twenty-sixth Day of August, 2025

Coke Morgan Stewart  
*Acting Director of the United States Patent and Trademark Office*